United States Patent [19]

Melton

[11] Patent Number: 5,316,205
[45] Date of Patent: May 31, 1994

[54] METHOD FOR FORMING GOLD BUMP CONNECTION USING TIN-BISMUTH SOLDER

[75] Inventor: Cynthia Melton, Bolingbrook, Ill.

[73] Assignee: Motorola, Inc., Schaumburg, Ill.

[21] Appl. No.: 43,102

[22] Filed: Apr. 5, 1993

[51] Int. Cl.$^5$ ............................................. H05K 3/34
[52] U.S. Cl. ........................... 228/180.21; 228/262.61; 437/209; 174/259; 420/562
[58] Field of Search ............... 228/180.2, 123, 263.18, 228/262.61, 180.21, 193; 174/259; 437/209; 420/562

[56] References Cited

U.S. PATENT DOCUMENTS

| | | | |
|---|---|---|---|
| 4,636,073 | 1/1987 | Williams | 356/243 |
| 4,761,699 | 8/1988 | Ainslie et al. | 360/103 |
| 5,133,495 | 7/1992 | Angulus et al. | 228/248 |
| 5,156,997 | 10/1992 | Kumar et al. | 437/183 |
| 5,186,383 | 2/1993 | Melton et al. | 228/180.2 |
| 5,221,038 | 6/1993 | Melton et al. | 228/180.2 |

OTHER PUBLICATIONS

American Society for Metals, "Soldering", *Welding, Braising and Soldering*, vol. 6, Metals Handbook, 9th Edition, 1983, pp. 1069 through 1076.

Murphy, Jim, "*Tin-Bismuth Alloy Plating, a Fusible Low Temperature Etch Resist for High Aspect Ratio PC Boards*", presented at IPC Fall Meeting, Oct. 7, 12, 1990, San Diego, Calif.

Prints, A. et al., *Phase Diagrams of Terniary Gold Alloys*, The Institute of Metals, London (1990).

*Primary Examiner*—Samuel M. Heinrich
*Attorney, Agent, or Firm*—Douglas D. Fekete

[57] ABSTRACT

A gold bump contact on an electronic component is solder bonded to a bond pad of a printed circuit board or the like utilizing a solder composed of tin-bismuth alloy. The solder is applied to the bond pad as an electroplate or a paste, after which the gold bump is superposed onto the bond pad. The assembly is heated to a first temperature to melt the solder and thereafter maintained at a temperature less than 150° C. to permit the molten solder to wet the gold surface, after which the assembly is cooled to solidify the solder and complete the connection. Wetting at the relatively low temperature retards dissolution of the gold and thereby reduces formation of unwanted gold tin intermetallic compounds that tend to decrease mechanical properties of the connection.

7 Claims, 1 Drawing Sheet

METHOD FOR FORMING GOLD BUMP CONNECTION USING TIN-BISMUTH SOLDER

BACKGROUND OF THE INVENTION

This invention relates to forming a solder connection for attaching a gold bump contact of an electronic component to a printed circuit or the like. More particular, this invention relates to an improved method for solder bonding to a gold bump contact utilizing a solder formed of tin-bismuth alloy.

In the manufacture of microelectronic packages, it is known to attach an electronic component to a printed circuit board by soldering to a gold bump contact. For example, a tape automated bonding, a gold bump is affixed to a copper lead on the component. The printed circuit board comprises a copper trace that includes a site, referred to herein as a bond pad, at which the connection is to be formed. Solder, which may be metallic tin or a tin alloy, is applied to the bond pad. With the gold bump superposed onto the bond pad, the assembly is heated and cooled to melt and resolidify the solder to bond the gold bump to the trace. The gold bump connection not only physically attaches the component to the printed circuit board, but also electrically connects the lead of the component to the bond pad on the board for conducting electrical signals to or form the component for processing.

In forming the connection, the assembly is heated to a temperature above the melting point of the tin solder for a time sufficient not only to melt the solder, but also the permit the molten metal to wet the gold surface, which wetting is essential to forming a strong solder bond. Moveover, it is common practice to exceed the melting point by about 40° C. to reduce the time required to complete the the soldering process. Thus, for metallic tin having a melting point of about 232° C., the reflow rate temperatures approach 270° C. For some microelectronic packages, such high temperatures tend to damage electrical features remote from the connection. In manufacturing packages that include temperature sensitive components, gold bump connections may be formed using a solder formed of lower melting tin lead alloy. Tin-bismuth solder alloy is also known for forming lead-free connections.

There is a tendency for gold to dissolved into the tin liquid during reflow and to form tin gold intermetallic phases, which is predominantly $AuSn_2$, particularly at the higher reflow temperatures. In connections formed with higher melting alloys, the product connection retains sufficient mechanical strength despite the intermetallic phase to permit used within the temperature range normally experienced by such microelectronic packages during operation. However, in connections formed utilizing lower melting tin-bismuth alloy, the formation of the intermetallic phase significantly reduces the mechanical properties of the connection within the revelant operational temperature range. Therefore, there remains a need for a method for forming a connection to a solder bump contact using tin-bismuth solder alloy that reduces the detrimental effect of intermetallic gold tin phases.

SUMMARY OF THE INVENTION

This invention contemplates an improved method for solder bonding a gold bump contact of an electronic component to a bond pad on a substrate utilizing a solder alloy composed of tin and bismuth. The solder alloy may be applied to the bond pad as an electroplate. Alternately, a solder paste comprising tin bismuth solder particles may applied to the bond pad. In any event, the component is assembled with the substrate such that the gold bump contact is superposed onto the bond pad. The assembly is briefly heated to a first temperature above 150° C. for a minimal time, preferably less than 20 seconds, to melt the tin-bismuth alloy to form molten solder. Thereafter, the assembly is maintained at a temperature less than 150° C., to permit the solder alloy to flow and wet the gold surface, which is essential for forming a strong solder bond. This lower temperature retards dissolution of gold into the molten solder. Furthermore, with respect to gold that may dissolve, it is believed that the nature and distribution of the intermetallic tin phases has a lesser effort in reducing the mechanical properties of the solder connection, in comparison to phases formed after extended time at higher temperature. Thus, upon cooling the assembly to solidify the molten solder, the method of this invention forms a connection having enhanced mechanical properties.

BRIEF DESCRIPTION OF THE DRAWINGS

The present invention will be further illustrated with reference to the accompanying drawings wherein.

DETAIL DESCRIPTION OF THE INVENTION

Figure 1:
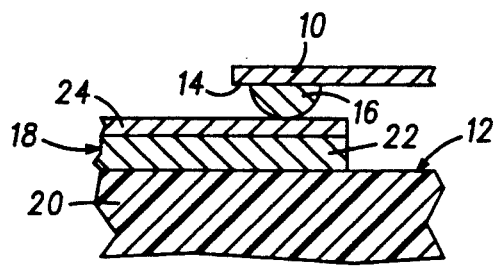
FIG. 1 is cross-sectional view showing an assembly of a gold bumped lead and a printed circuit board in preparation for forming a solder connection by the method of this invention.
Figure 2:
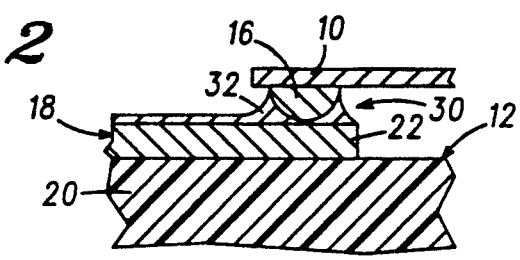
FIG. 2 is a cross-sectional view of the assembly in FIG. 1 following solder reflow to form the solder connection.
Figure 3:
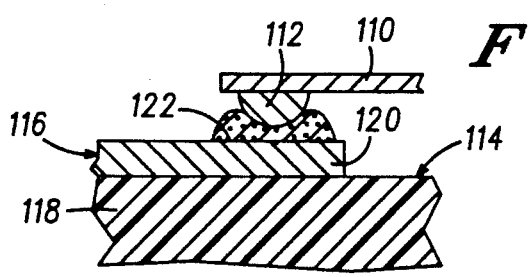
FIG. 3 is a cross-sectional view of an assembly similar to FIG. 1, but adapted for forming a solder connection by an alternate embodiment of this invention.

In the preferred embodiment, referring to FIGS. 1 through 3, this invention is utilized in conjunction with a tape automated bonding operation to attach a lead 10 of an electronic component (not shown) to a printed circuit board 12. Lead 10 is formed of metallic copper and comprises a surface 14 opposite printed circuit board 12. A gold bump contact 16 is affixed to surface 14 by a thermocompression process that fuses the gold to the copper.

Printed circuit board 12 comprises a metallic copper trace 18 affixed to a dielectric substrate 20 of the type referred to as an FR4 card and composed of an epoxy resin and glass fiber laminate. Trace 18 comprises a surface mount pad 20 that is the site for attaching lead 10 and further includes a plate 24 formed of a solder alloy composed substantially of tin and bismuth.

In a preferred embodiment, printed circuit board 12 is manufactured by a method that includes electrodepositing solder plate 24 onto a copper layer and utilizing the solder plate as an etch mask in defining trace 18. For this purpose, a board is commercially obtained comprising a copper layer uniformly covering the major surface of the epoxy laminate substrate 20. A photo-resist mask is applied to the copper layer and developed to define openings in a pattern corresponding to the desired trace 18. Tin-bismuth alloy is then electroplated onto the exposed copper. A suitable plating solution contains between about 6 and 8 grams per liter bismuth, added as bismuth methane sulfonate, $Bi(CH_3SO_3)_3$; between about 4 and 8 grams per liter tin, added as tin methane sulfonate, $Sn(CH_3SO_3)_2$; and between about 100 and 150 grams per liter methane sulfonic acid solution, $CH_3O_3H$; in water, together with minor additions of methanol, an organic surfactant and other compounds to promote plating. The bismuth methane sulfonate, tin methane sulfonate and methane sulfonic acid are commercially available as concentrated solutions. Board 12 is immersed in the solution at ambient temperature, spaced apart from a suitable counterelectrode. A suitable counter electrode is formed of metallic tin. Alternately, the counterelectrode may be formed of tin-bismuth alloy to replenish bismuth as well as tin during extended operation, or may be an inert electrode formed, for example, of platinum-plated titanium. An electrical current of about 15 or 30 milliamperes per square centimeter is applied to cathodically bias the copper layer to concurrently reduce tin and bismuth ions to their respective metals and thereby deposit tin-bismuth alloy onto the exposed copper. Plating is continued to deposit a plate 24 having a thickness of about 25 microns and composed of between about 48 and 68 weight percent bismuth and the balance tin. Following electroplating, the photo-resist mask is removed, thereby exposing the copper about the plated trace. The board is then immersed in an aqueous copper-etching solution comprising cupric chloride to remove the exposed copper. The tin-bismuth plate 24 is resistant to attack by the copper-etching solution and protects the underlying copper during etching to define trace 18.

The component with lead 10 comprising gold bump contact 16 is then assembled with printed circuit board 12 to form the assembly shown in FIG. 1, wherein gold bump 16 rests against plate 24 at bond pad 22. A flux formed of a white rosin compound may be applied to the gold bump or the solder plate at the bond pad to promote reflow of the solder alloy. The assembly is then heated to reflow plate 24. In accordance with this invention, the assembly is heated rapidly from ambient temperature to a maximum temperature of 170° C. to melt plate 24 and form molten solder. During this time, the assembly was above 150° C. for a total of about 10 seconds. The assembly is then cooled to a temperature between about 145° C. and 150° C. and maintained at the lower temperature for about 60 seconds. During this time, the molten solder wets the gold surface of contact 16. Thereafter, the assembly is cooled to room temperature, where upon the molten solder solidifies. The resulting connection 30 is shown in FIG. 2 and comprises the reflowed solder 32 bonded to bump 16 and bond pad 22 to physically and electrically connect lead 10 to trace 18.

Figure 4:
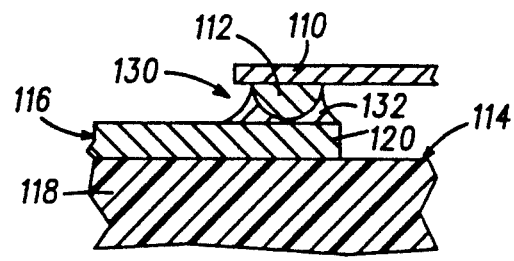
FIG. 4 is a cross-sectional view of the assembly in FIG. 3 following solder reflow to form the solder connection.

In an alternate embodiment shown in FIGS. 3 and 4, the method of this invention is employed in forming a connection using a solder paste. For this purpose, the component comprises a copper lead 110 to which is affixed a gold bump contact 112, similar to lead 10 comprising gold bump contact 16 in FIG. 1. Printed circuit board 114 comprises a copper trace 116 carried on a substrate 118 similar to printed to circuit board 12 in FIG. 1. Trace 116 includes a bond pad 120 for attaching gold bump contact 112 and is formed utilizing conventional photolithographic processing but without the tin-bismuth plate 24. In accordance with this embodiment, a deposit 122 of a solder paste is screened printed onto bond pad 120. A preferred, commercially available paste comprises powder consisting of tin-bismuth solder alloy having a near eutectic composition of about 60 weight percent bismuth and the balance tin. The tin-bismuth powder is sized between $-200$ and $+325$ mesh and is dispersed in a solvent composed of high-boiling alcohols and glycol and containing a flux composed of a white rosin compound. The paste also includes an expendable organic binder, suitable ethyl cellulose compound, effective to bond the powder into a cohesive deposit.

Following application of the solder paste, the component is arranged with gold bump contact 112 against solder paste deposit 122. The solder paste assists in tacking the gold bump 112 in position on the bond pad. The assembly is then heated to a maximum temperature of about 170° C. and is above 150° C. for about 10 seconds. During this time, residual solvent and organic binder in deposit 122 is vaporized, and the tin-bismuth particles melt and coalesce to produce a solder liquid. The assembly is then cooled to a temperature between about 145° C. and 150° C. and maintained at the temperature for about 60 seconds, during which time the solder liquid wets the gold surface. The reflow of the solder liquid was accompanied by collapse of the gold bump 112 toward bond pad 120 as shown in FIG. 4. Upon cooling to room temperature, the molten solder solidified and bonded to gold bump 112 and bond pad 120. Solder connection 130 in FIG. 4 comprises gold bump 112 bonded to bond pad 120 by tin-bismuth solder 132.

Therefore, this invention provides an improved method for forming a connection to bond a gold bump contact to a solder-wettable pad on a printed circuit board using a solder derived from tin-bismuth alloy, whether deposited as a plate such as electroplate 24 in FIG. 1 or as a solder paste such as deposit 122 in FIG. 3. Tin and bismuth form a eutectic composition composed of about 42 weight percent tin and 58 weight percent bismuth and having a melting temperature of about 138.5° C. Although the initial alloy consists of tin and bismuth and is substantially free of gold, the connection contains gold dissolved from the gold bump during reflow. In general, the method of this invention comprises heating the assembly to a first temperature to melt the solder alloy and thereafter maintaining the assembly at a second temperature less than the first temperature during which the molten solder wets the gold contact. While not limited to any particular theory, maintaining the assembly at the second, lower temperature during wetting reduces the rate of gold dissolution into the molten solder, which dissolved gold tends to combine with tin to form intermetallic phases within the solder.

A solder connection formed using a solder paste, similar to connection 130 in FIG. 4 was reflowed by heating above 150° C. for 10 seconds and thereafter maintaining at below 150° C. for 60 seconds. The connection was sectioned and examined using a scanning electron microscope. Gold-tin intermetallic phase was readily identifiable in the form of rod-like particles dispersed in a tin-bismuth matrix. For purposes of comparison, a similar connection was formed by a conventional method which tin-bismuth solder paste was heated to 170° C. for 30 seconds and cooled. It is was observed that the proportion of intermetallic particles was less in the connection formed in accordance with this invention and that the intermetallic phase tended to be dispersed proximate to the gold bump, in contrast to the higher proportion and more uniform dispersion obtained in the connection formed at the higher reflow temperature. The lesser amount of intermetallic phase and the non-uniform distribution tend to improve mechanical properties in the connection formed in accordance with this invention.

Moreover, it is believed that the lower reflow temperatures tend to form $AuSn_4$ phase and that the $AuSn_4$ phase has a less detrimental effect upon the mechanical properties of the solder than the $AuSn_2$ phase that is favored at higher reflow temperatures.

In general, it is desired to minimize the time of the heating cycle to reduce gold dissolution. However, temperatures less than 150° C. prolongs the time required to melt the solder, whereas prior to melting gold dissolution is inhibited. Thus, melting may be suitably carried out at temperature above 150° C. and preferably up to about 170° C. In view of the small mass of solder utilized in such microelectronic connections, less that about 20 seconds is sufficient to assure melting. Melting within 10 to 20 seconds is preferred. Thereafter, the temperature is reduced to less than about 150° C., but still above the solder melting temperature. Temperatures between about 145° C. and 150° C. are preferred to facilitate wetting while avoiding premature solidification. The assembly is held for at least 30 seconds to assure wetting, whereas times greater than about 90 seconds tend to increase gold dissolution without significant advantage. Optimum results are obtained by holding for between about 60 to 90 seconds.

The method of this invention utilizes a solder alloy formed of tin and bismuth. In general, tin alloys containing less than about 30 weight percent or greater than about 70 weight percent bismuth require relatively high reflow temperatures and are not suitable for use in forming connections by the method of this invention. The preferred alloy contains between about 48 and 68 weight percent bismuth. The initial alloy may include small amounts, typically less than four percent, of other alloying agents to enhance other mechanical properties. While in the described embodiment, the method of this invention was carried out to bond a copper lead to a copper trace, the method may be readily adapted for forming a bond utilizing faying surfaces formed of other metals that are wettable by molten tin-bismuth solder alloy. Moreover, the method may be adapted to form a bond in applications other than tape automated bonding operation described in the preferred embodiment. For example, the method of this invention may be utilized to form tin-bismuth solder bonds to gold bumps applied to bond pads directly on face of an integrated circuit device in forming solder bump interconnections by a flip-chip process.

While this invention has been described in terms of certain embodiments, it is not intended that it be limited to the above description, but rather only to the extent set forth in the claims that follow. The embodiments of the invention in which an exclusive property or privilege is claimed are defined as follows.

I claim:

1. A method for attaching an electronic component to a substrate, said component comprising a gold bump contact, said substrate comprising a bond pad formed of a solder-wettable metal, said method comprising applying to the bond pad a solder alloy composed predominantly of tin and bismuth, assembling the electronic component and the substrate to form an assembly such that a surface of the gold bump contact rests adjacent to the bond pad and the solder alloy, heating the assembly to a first temperature to melt the solder alloy to form molten solder and thereafter maintaining the assembly at a second temperature less than 150° C. for a time of at least 30 seconds to cause said molten solder to wet the gold surface, and cooling the assembly to solidify the molten solder alloy, whereupon the solder bonds to the gold contact and to the bond pad to connect the component to the substrate.

2. A method in accordance with claim 1 wherein the solder alloy is composed of between about 30 and 70 weight percent bismuth and the balance tin.

3. A method in accordance with claim 1 wherein the solder alloy is composed substantially of between about 48 and 68 weight percent bismuth and the balance tin.

4. A method in accordance with claim 1 wherein the assembly is heated at a first temperature above 150° C. for a time less than about 20 seconds.

5. A method in accordance with claim 1 wherein the second temperature is between about 145° C. and 150° C. and wherein the assembly is heated at the second temperature for between about 60 and 90 seconds.

6. A method for connecting and electronic component to a printed circuit board, said component comprising a copper lead and a gold bump contact affixed to the lead, said printed circuit board comprising a copper trace having bond pad that is adapted for connecting the component, said method comprising electrodepositing a solder plate onto the bond pad, said solder plate consisting essentially of between about 48 and 69 weight percent bismuth and the balance tin, assembling the electronic component and the printed circuit board to form an assembly such that a surface of the gold bump contact rests against the plate at the bond pad, heating the assembly to a first temperature above 150° C. for a time less than 20 seconds to melt the solder plate to form molten solder and thereafter maintaining the assembly at a second temperature less than 150° C. for a time between about 60 and 90 seconds to cause said molten solder to wet the gold surface, and cooling the assembly to solidify the molten solder, whereupon the solder bonds to the gold contact and to the bond pad to connect the component to the printed circuit board.

7. A method for connecting an electronic component to a printed circuit board, said component comprising a copper lead and a gold bump contact affixed to the lead, said printed circuit board comprising a copper trace having bond pad that is adapted for connecting the component, said method comprising applying a solder paste to form a deposit on the bond pad, said paste comprising solder particles consisting essentially of between about 48 and 68 weight percent bismuth and the balance tin, assembling the electronic component and the printed circuit board to form as assembly such that a surface of the gold bump contact lies adjacent the solder paste deposit on the bond pad, heating the assembly to a first temperature above 150° C. for time less than 20 seconds to melt the solder plate to form molten solder and thereafter maintaining the assembly at a second temperature less than 150° C. for a time between about 60 and 90 seconds to cause said molten solder to wet the gold surface, and cooling the assembly to solidify the molten solder, whereupon the solder bonds to the gold contact and to the bond pad to connect the component ot the printed circuit board.

* * * * *